(12) United States Patent
Hamada

(10) Patent No.: US 9,018,095 B2
(45) Date of Patent: Apr. 28, 2015

(54) FORMATION OF CONDUCTIVE CIRCUIT, CONDUCTIVE CIRCUIT, AND CONDUCTIVE INK COMPOSITION

(71) Applicant: Shin-Etsu Chemical Co., Ltd., Tokyo (JP)

(72) Inventor: Yoshitaka Hamada, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/306,467

(22) Filed: Jun. 17, 2014

(65) Prior Publication Data
US 2014/0374905 A1 Dec. 25, 2014

(30) Foreign Application Priority Data
Jun. 19, 2013 (JP) .................................. 2013-128618

(51) Int. Cl.
| | | |
|---|---|---|
| H01L 21/228 | (2006.01) |
| H01L 23/58 | (2006.01) |
| H01L 21/288 | (2006.01) |
| C09D 11/52 | (2014.01) |
| H05K 1/09 | (2006.01) |
| H05K 3/12 | (2006.01) |
| C08K 3/08 | (2006.01) |
| C09D 11/03 | (2014.01) |
| C09D 183/04 | (2006.01) |

(52) U.S. Cl.
CPC .............. *H01L 21/288* (2013.01); *C09D 11/52* (2013.01); *H05K 1/09* (2013.01); *H05K 3/12* (2013.01); *C08K 3/08* (2013.01); *C08K 2003/0806* (2013.01); *C09D 11/03* (2013.01); *C09D 183/04* (2013.01); *H01L 23/58* (2013.01)

(58) Field of Classification Search
CPC .............................. H01L 21/228; H01L 23/58
USPC ........................................... 438/669; 257/746
See application file for complete search history.

(56) References Cited

U.S. PATENT DOCUMENTS

| 3,159,662 | A | 12/1964 | Ashby | |
|---|---|---|---|---|
| 3,220,972 | A | 11/1965 | Lamoreaux | |
| 3,775,452 | A | 11/1973 | Karstedt | |
| 6,797,772 | B2 * | 9/2004 | Nakayoshi et al. | ........... 524/731 |
| 7,074,849 | B2 | 7/2006 | Nakayoshi et al. | |
| 2009/0253846 | A1 * | 10/2009 | Fukui | ............. 524/430 |
| 2011/0188213 | A1 * | 8/2011 | Domae et al. | ................. 361/748 |
| 2012/0207917 | A1 | 8/2012 | Hamada et al. | |
| 2013/0092423 | A1 | 4/2013 | Hamada et al. | |

FOREIGN PATENT DOCUMENTS

| EP | 2582214 A2 | 4/2013 |
|---|---|---|
| JP | 7-109501 A | 4/1995 |
| JP | 11/213756 A | 8/1999 |
| JP | 2007-53109 A | 3/2007 |
| JP | 2010-149301 A | 7/2010 |

OTHER PUBLICATIONS

Extended European Search Report dated Oct. 29, 2014, issued in corresponding European Patent Application No. 14172470.8 (5 pages).

* cited by examiner

*Primary Examiner* — Luan C Thai
(74) *Attorney, Agent, or Firm* — Westerman, Hattori, Daniels & Adrian, LLP

(57) ABSTRACT

A conductive circuit is formed by printing a pattern of an ink composition and curing the pattern. The ink composition is a substantially solvent-free, liquid, addition curable, ink composition comprising (A) an organopolysiloxane having at least two alkenyl groups, (B) an organohydrogenpolysiloxane having at least two SiH groups, (C) conductive particles having an average particle size ≥5 μm, (D) conductive microparticles having an average particle size <5 μm, (E) a thixotropic agent, and (F) a hydrosilylation catalyst.

6 Claims, No Drawings

FORMATION OF CONDUCTIVE CIRCUIT, CONDUCTIVE CIRCUIT, AND CONDUCTIVE INK COMPOSITION

CROSS-REFERENCE TO RELATED APPLICATION

This non-provisional application claims priority under 35 U.S.C. §119(a) on Patent Application No. 2013-128618 filed in Japan on Jun. 19, 2013, the entire contents of which are hereby incorporated by reference.

TECHNICAL FIELD

This invention relates to a method for forming a conductive circuit using a conductive ink composition, more particularly, to a method for forming a conductive circuit using a printing technique and a silicone rubber as the structural material of printed pattern. It also relates to a conductive circuit and conductive circuit-forming ink composition.

BACKGROUND ART

The technology of forming a conductive circuit by printing an ink composition containing conductive particles is already commercially implemented, for example, in the solar cell application wherein a conductive circuit is formed on a cell substrate by screen printing. A number of improvements in this technology have been proposed. For example, Patent Document 1 discloses that a conductive ink composition containing metal particles and glass frit, which is commonly used in the art, is printed by screen printing with the aid of ultrasonic oscillation. This method enables high speed formation of conductive circuits.

A problem arises when a circuit is formed on a semiconductor circuit board using a conductive ink composition based on glass. If the board is heated after circuit formation for substrate bonding or packaging purpose, the conductive ink composition may be cracked or otherwise stressed to cause a resistance change or breakage to the conductor. There is a need for a circuit-forming material having high stress resistance. Silicone material is characterized by heat resistance and stress relaxation. Patent Document 2 discloses that an ink composition comprising a thermoplastic resin, epoxy-modified silicone, metal powder, and silicone rubber elastomer is diluted with a solvent and used to form a conductive circuit which is not cracked or adversely affected on heat treatment. It is also known that conductive particles are dispersed in silicone rubber to form an ink composition.

The current trend is toward miniaturization of semiconductor circuits, and the size of concomitant conductive circuits also becomes finer. Also efforts are made on the so-called 3D semiconductor device, that is, a stacked semiconductor circuit structure obtained by forming a semiconductor circuit on a substrate, and stacking two or more such substrates. When such fine semiconductor circuits are provided with a plurality of contacts and packaged, or when interconnects are formed between semiconductor circuits on two or more silicon substrates, the conductive circuit to be connected is not only required to be resistant to thermal stress, but also needs to control its shape as fine structure.

For instance, if a conductive circuit including lines of different width is formed using a conductive ink composition containing a solvent, the flatness or shape of conductor lines may change in some areas before and after curing, or a height difference of the circuit may develop under the influence of certain factors such as the volatilization rate of the solvent. If connection is achieved while taking into account the influence, the margin for miniaturization may be lost. In attempts to achieve further miniaturization of semiconductor devices or to construct 3D stacking of semiconductor devices, it would be desirable to have a technology of forming a conductive circuit using a conductive ink composition that allows for stricter control of the circuit shape.

The above-mentioned ink composition having metal particles dispersed in silicone rubber becomes useful in forming a conductive circuit by printing when a thixotropic agent is added thereto. The printed circuit maintains its shape unchanged before and after curing. Further the circuit thus formed has a high stress relaxation ability to thermal stress or the like. However, when only conductive particles having a particle size of at least 5 μm contributing to least thixotropy are used, a problem arises with regard to conduction to electrodes. Although the resistivity of the bulk can be controlled in accordance with the amount of conductive particles added, there are available least conductive paths between conductive particles in the silicone rubber composition and electrodes, which may lead to a high contact resistance. An improvement in this respect is desired.

CITATION LIST

Patent Document 1: JP-A 2010-149301
Patent Document 2: JP-A H11-213756
Patent Document 3: JP-A 2007-053109
Patent Document 4: JP-A H07-109501

DISCLOSURE OF INVENTION

An object of the invention is to provide a method for forming a conductive circuit by printing, a conductive circuit, and a conductive ink composition, ensuring that the conductive circuit is effectively printed, and the conductive circuit thus printed retains its shape before and after curing, has low contact resistance with electrodes, and has a stress relaxation ability with respect to thermal stress or the like.

The inventor sought for a material capable of meeting the above requirements. Since a silicone rubber-forming material offers a fluidity necessary for an ink composition to be printed without a need for solvent, it is conceived that a silicone rubber composition (to be defined below) may be printed to form a conductive circuit which undergoes no shape change after printing and curing and has a stress relaxation ability. When metal particles or metal-plated particles having a particle size of at least 5 μm are used as the conductive particles, the addition of such conductive particles allows for resistivity control, but does not substantially affect thixotropy. Then, finer particles of carbon black or the like are added to control thixotropy. The resulting composition, however, is disadvantageous with respect to the conduction between the cured composition and electrodes. Contact resistance may increase probably because of a low population of conductive particles in the cured composition. It has been found that when an appropriate amount of finer conductive micro-particles is added, a multiplicity of conductive paths are established between conductive micro-particles and electrodes, leading to a reduced contract resistance. Since the particle size of micro-particles to be added is small, their influence on the thixotropy of the composition becomes of significance. Then by comprehensively controlling the amount of micro-particles added and the amount of thixotropic agent (e.g., carbon black) added, there is obtained a composition which ensures effective printing and affords a cured product or conductive silicone rubber having satisfactory shape stability and low contact resistance.

In one aspect, the invention provides a method for forming a conductive circuit comprising the steps of printing a pattern using a conductive ink composition and curing the pattern into a conductive circuit. The conductive ink composition is a substantially solvent-free, liquid, addition curable, conductive circuit-forming ink composition comprising (A) an organopolysiloxane having at least two silicon-bonded alkenyl groups, (B) an organohydrogenpolysiloxane having at least two silicon-bonded hydrogen atoms (or SiH groups), (C) conductive particles having an average particle size of at least 5 μm, selected from the group consisting of metal particles, gold-plated particles, silver-plated particles, and copper-plated particles, (D) conductive micro-particles having an average particle size of less than 5 μm, selected from the group consisting of metal particles, gold-plated particles, silver-plated particles, and copper-plated particles, component (D) being present in an amount of at least 1 part by volume per 100 parts by volume of component (A), (E) a thixotropic agent, and (F) a hydrosilylation catalyst.

Preferably in the ink composition, component (C) is present in an amount of up to 120 parts by volume and component (D) is present in an amount of up to 20 parts by volume per 100 parts by volume of component (A). The thixotropic agent (E) is typically carbon black, zinc white, tin oxide, tin-antimony oxide or silicon carbide (SiC). The printing step is preferably by screen printing.

Also contemplated herein are a conductive circuit which has been formed by the method defined above, and a conductive circuit-forming ink composition as defined above.

Advantageous Effects of Invention

The conductive ink composition is thixotropic and effectively printable. The method of the invention ensures that a conductive circuit is formed from the thixotropic ink composition by printing techniques, typically screen printing. There are many advantages including a low ohmic resistance, good shape reproduction of printed circuits, high-speed printing, high throughputs and yields of pattern formation. The circuit as printed retains its shape even during the cure step following printing, leading to high-level control of the circuit shape. Because of the silicone rubber-based structure, the printed circuit has a stress relaxation ability with respect to thermal stress or the like.

DESCRIPTION OF PREFERRED EMBODIMENTS

As used herein, the term "conductive" refers to electrical conduction. The term "powder" is sometimes used as a collection of particles.

As briefly stated above, the method for forming a conductive circuit according to the invention comprises the steps of printing a pattern using a conductive ink composition and curing the pattern into a conductive circuit. The conductive ink composition is a substantially solvent-free, liquid, addition curable, conductive circuit-forming ink composition comprising (A) an organopolysiloxane having at least two silicon-bonded alkenyl groups, (B) an organohydrogenpolysiloxane having at least two silicon-bonded hydrogen atoms (or SiH groups), (C) conductive particles having an average particle size of at least 5 μm, selected from among metal particles, gold-plated particles, silver-plated particles, and copper-plated particles, (D) conductive micro-particles having an average particle size of less than 5 μm, selected from among metal particles, gold-plated particles, silver-plated particles, and copper-plated particles, component (D) being present in an amount of at least 1 part by volume per 100 parts by volume of component (A), (E) a thixotropic agent, and (F) a hydrosilylation catalyst.

For high-precision control of the shape of a conductive circuit pattern during printing and subsequent curing, it is desirable to cure the pattern formed in the printing step while maintaining the pattern shape unchanged. To this end, the conductive circuit-printing ink composition should be selected from those materials capable of minimizing the generation of volatile components for the duration from printing step to the completion of curing step. The ink composition should be prepared substantially without using a solvent.

Differently stated, the conductive circuit-imaging ink composition used herein is defined as comprising a silicone rubber precursor (components A and B) in combination with a curing catalyst (component F), a conductivity-providing material (components C and D), and a thixotropic agent (component E) for adjusting the thixotropy of the composition.

Curable silicone materials are divided into condensation and addition types in terms of cure mechanism. Silicone-forming materials, specifically silicone rubber-forming materials of the addition type are best suited for the object of the invention because they may be cured without outgassing. In order that a patterning material be cured while maintaining the shape as printed intact, it is preferred that the material be curable under mild conditions below 200° C., especially below 150° C. Silicone-forming materials of the addition type readily meet this requirement.

As to the combination of an addition type silicone precursor with a curing catalyst, numerous materials are known in the art as described in Patent Document 3, for example. Basically, any well-known materials may be used herein. The material which is most preferred as the addition type silicone precursor is a mixture of an organopolysiloxane containing at least two silicon-bonded alkenyl groups and an organohydrogenpolysiloxane containing at least two silicon-bonded hydrogen atoms. They are described in detail below.

A) Organopolysiloxane Containing at Least Two Alkenyl Groups

The organopolysiloxane containing at least two alkenyl groups is represented by the average compositional formula (1):

$$R_a R'_b SiO_{(4-a-b)/2} \tag{1}$$

wherein R is alkenyl, R' is a substituted or unsubstituted monovalent hydrocarbon group of 1 to 10 carbon atoms free of aliphatic unsaturation, a and b are numbers in the range: $0 < a \leq 2$, $0 < b < 3$, and $0 < a+b \leq 3$.

The alkenyl-containing organopolysiloxane serves as component (A) or a base polymer in the composition. This organopolysiloxane contains on average at least 2 (typically 2 to about 50), preferably 2 to about 20, and more preferably 2 to about 10 silicon-bonded alkenyl groups per molecule. Exemplary of the alkenyl group R are vinyl, allyl, butenyl, pentenyl, hexenyl and heptenyl, with vinyl being most preferred. The alkenyl groups are attached to the organopolysiloxane at the ends and/or side chains of its molecular chain.

The organopolysiloxane as component (A) contains a silicon-bonded organic group R' other than alkenyl. Examples of the organic group R' include alkyl groups such as methyl, ethyl, propyl, butyl, pentyl, hexyl and heptyl; aryl groups such as phenyl, tolyl, xylyl, and naphthyl; aralkyl groups such as benzyl and phenethyl; and haloalkyl groups such as chloromethyl, 3-chloropropyl, and 3,3,3-trifluoropropyl. Inter alia, methyl and phenyl are preferred.

The organopolysiloxane as component (A) has a molecular structure which may be linear, partially branched linear, cyclic, branched or three-dimensional network. The preferred organopolysiloxane is a linear diorganopolysiloxane having a backbone consisting of recurring diorganosiloxane units (D units) and capped with triorganosiloxy groups at both ends of the molecular chain, or a mixture of a linear diorganopolysiloxane and a branched or three-dimensional network organopolysiloxane.

The resinous (branched or three-dimensional network) organopolysiloxane is not particularly limited as long as it is an organopolysiloxane comprising alkenyl groups and $SiO_{4/2}$ units (Q units) and/or $R''SiO_{3/2}$ units (T units) wherein $R''$ is R or R'. Examples include a resinous organopolysiloxane consisting of Q units ($SiO_{4/2}$ units) and M units ($RR'_2SiO_{1/2}$ units or $R'_3SiO_{1/2}$ units) in a M/Q molar ratio of 0.6 to 1.2, and a resinous organopolysiloxane consisting of T units and M and/or D units. In the practice of the invention, the resinous organopolysiloxane is not added in large amounts because the composition containing a resinous organopolysiloxane may have a higher viscosity enough to prevent heavy loading of conductive powder. Preferably the linear diorganopolysiloxane and the resinous organopolysiloxane are mixed in a weight ratio between 70:30 and 100:0, more preferably between 80:20 and 100:0.

The subscripts a and b are numbers in the range: $0 < a \le 2$, preferably $0.001 \le a \le 1$, $0 < b < 3$, preferably $0.5 \le b \le 2.5$, and $0 < a+b \le 3$, preferably $0.5 \le a+b \le 2.7$.

The organopolysiloxane as component (A) has a viscosity at 25° C. in the range of preferably 100 to 5,000 mPa·s, more preferably 100 to 1,000 mPa·s because the resulting composition is easy to handle and work and the resulting silicone rubber has favorable physical properties. When a linear organopolysiloxane and a resinous organopolysiloxane are used in admixture, a homogeneous mixture should preferably have a viscosity in the range. Since the resinous organopolysiloxane dissolves in the linear organopolysiloxane, they may be mixed into a homogeneous mixture. Notably, the viscosity is measured by a rotational viscometer.

Examples of the organopolysiloxane as component (A) include, but are not limited to, trimethylsiloxy-endcapped dimethylsiloxane/methylvinyl-siloxane copolymers, trimethylsiloxy-endcapped methylvinylpolysiloxane, trimethylsiloxy-endcapped dimethylsiloxane/methylvinyl-siloxane/methylphenylsiloxane copolymers, dimethylvinylsiloxy-endcapped dimethylpolysiloxane, dimethylvinylsiloxy-endcapped methylvinylpolysiloxane, dimethylvinylsiloxy-endcapped dimethylsiloxane/methylvinyl-siloxane copolymers, dimethylvinylsiloxy-endcapped dimethylsiloxane/methylvinyl-siloxane/methylphenylsiloxane copolymers, trivinylsiloxy-endcapped dimethylpolysiloxane, organosiloxane copolymers consisting of siloxane units of the formula: $R^1_3SiO_{0.5}$, siloxane units of the formula: $R^1_2R^2SiO_{0.5}$, siloxane units of the formula: $R^1_2SiO$, and siloxane units of the formula: $SiO_2$, organosiloxane copolymers consisting of siloxane units of the formula: $R^1_3SiO_{0.5}$, siloxane units of the formula: $R^1_2R^2SiO_{0.5}$, and siloxane units of the formula: $SiO_2$, organosiloxane copolymers consisting of siloxane units of the formula: $R^1_2R^2SiO_{0.5}$, siloxane units of the formula: $R^1_2SiO$, and siloxane units of the formula: $SiO_2$, organosiloxane copolymers consisting of siloxane units of the formula: $R^1R^2SiO$, siloxane units of the formula: $R^1SiO_{1.5}$, and siloxane units of the formula: $R^2SiO_{1.5}$, and mixtures of two or more of the foregoing. As used herein and throughout the disclosure, the term "endcapped" means that a compound is capped at both ends with the indicated group unless otherwise stated.

In the above formulae, $R^1$ is a monovalent hydrocarbon group other than alkenyl, examples of which include alkyl groups such as methyl, ethyl, propyl, butyl, pentyl, hexyl and heptyl; aryl groups such as phenyl, tolyl, xylyl, and naphthyl; aralkyl groups such as benzyl and phenethyl; and haloalkyl groups such as chloromethyl, 3-chloropropyl, and 3,3,3-trifluoropropyl. $R^2$ is an alkenyl group such as vinyl, allyl, butenyl, pentenyl, hexenyl or heptenyl.

B) Organohydrogenpolysiloxane Containing at Least Two Hydrogen Atoms

The organohydrogenpolysiloxane containing at least two silicon-bonded hydrogen atoms serving as component (B) contains at least 2 (typically 2 to about 300), preferably at least 3 (typically 3 to about 150), and more preferably 3 to about 100 silicon-bonded hydrogen atoms, i.e., SiH groups per molecule. It may be linear, branched, cyclic or three-dimensional network (or resinous). The organohydrogenpolysiloxane preferably has the average compositional formula (2):

$$H_c R^3_d SiO_{(4-c-d)/2} \quad (2)$$

wherein $R^3$ is each independently a substituted or unsubstituted monovalent hydrocarbon group free of aliphatic unsaturation or an alkoxy group, c and d are numbers in the range: $0 < c < 2$, $0.8 \le d \le 2$, and $0.8 < c+d$ 3. Preferably, c and d are numbers in the range: $0.05 \le c \le 1$, $1.5 \le d \le 2$, and $1.8 \le c+d \le 2.7$. The number of silicon atoms per molecule or the degree of polymerization is preferably 2 to 100, more preferably 3 to 50.

Examples of the monovalent hydrocarbon group free of aliphatic unsaturation, represented by $R^3$, include the same groups as exemplified for R', and suitable alkoxy groups include methoxy and ethoxy. The preferred hydrocarbon groups are free of aromatic groups such as phenyl. Typically $R^3$ is selected from monovalent hydrocarbon groups of 1 to 10 carbon atoms, more preferably 1 to 7 carbon atoms, and specifically lower alkyl groups of 1 to 3 carbon atoms such as methyl, 3,3,3-trifluoropropyl, and alkoxy groups of 1 to 4 carbon atoms. More preferably $R^3$ is methyl, methoxy or ethoxy.

Examples of the organohydrogenpolysiloxane include, but are not limited to, siloxane oligomers such as 1,1,3,3-tetramethyldisiloxane, 1,3,5,7-tetramethyltetracyclosiloxane, 1,3,5,7,8-pentamethylpentacyclosiloxane, methylhydrogencyclopolysiloxane, methylhydrogensiloxane/dimethylsiloxane cyclic copolymers, and tris(dimethylhydrogensiloxy)methylsilane; trimethylsiloxy-endcapped methylhydrogenpolysiloxane, trimethylsiloxy-endcapped dimethylsiloxane/methylhydrogensiloxane copolymers, silanol-endcapped methylhydrogenpolysiloxane, silanol-endcapped dimethylsiloxane/methylhydrogensiloxane copolymers, dimethylhydrogensiloxy-endcapped dimethylpolysiloxane, dimethylhydrogensiloxy-endcapped methylhydrogenpolysiloxane, and dimethylhydrogensiloxy-endcapped dimethylsiloxane/methylhydrogensiloxane copolymers; and silicone resins comprising $R^3_2(H)SiO_{1/2}$ units, $SiO_{4/2}$ units, and optionally $R^3_3SiO_{1/2}$ units, $R^3_2SiO_{2/2}$ units, $R^3(H)SiO_{2/2}$ units, $(H)SiO_{3/2}$ units or $R^3SiO_{3/2}$ units wherein $R^3$ is as defined above. Also included are substituted forms of the above illustrated compounds in which some or all methyl is replaced by alkyl (such as ethyl or propyl) as well as the compounds shown below.

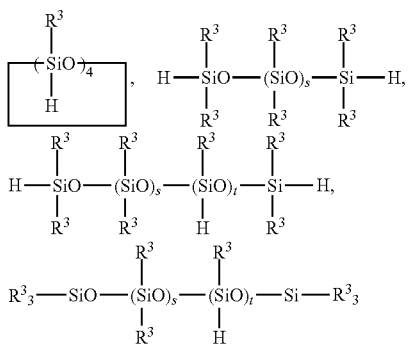

Herein $R^3$ is as defined above, s and t each are 0 or an integer of at least 1.

The organohydrogenpolysiloxane used herein may be prepared by any known methods. For example, it may be obtained from (co)hydrolysis of at least one chlorosilane selected from $R^3SiHCl_2$ and $R^3{}_2SiHCl$ (wherein $R^3$ is as defined above) or cohydrolysis of the chlorosilane in admixture with at least one chlorosilane selected from $R^3{}_3SiCl$ and $R^3{}_2SiCl_2$ (wherein $R^3$ is as defined above), followed by condensation. The polysiloxane obtained from (co)hydrolysis and condensation may be equilibrated into a product, which is also useful as the organohydrogenpolysiloxane.

Component (B) is preferably used in such amounts as to give 0.5 to 5.0 moles, more preferably 0.7 to 3.0 moles of silicon-bonded hydrogen per mole of silicon-bonded alkenyl groups in component (A). Outside the range, the cured product having sufficient strength may not be obtained because of unbalanced crosslinking.

C) Conductive Particles

The conductive circuit-forming ink composition contains (C) conductive particles having an average particle size of at least 5 microns (μm), selected from among metal particles, gold-plated particles, silver-plated particles, and copper-plated particles.

The conductive particles as component (C) include metal particles such as gold, silver and copper particles, and metallized particles such as gold-plated particles, silver-plated particles, and copper-plated particles. Inter alia, gold particles, silver particles, copper particles, and silver-plated plastic particles are preferred for high conductivity.

The conductive particles as component (C) should have an average particle size of at least 5 μm, preferably 5 to 50 μm, and more preferably 10 to 30 μm. As long as the average particle size of conductive particles is equal to or more than 5 μm, their influence on the thixotropy of the ink composition is limitative. Thus the amount of conductive particles loaded may be determined while taking into account only the resistivity. Notably inclusion of coarse particles having a size in excess of 50 μm is not preferable because coarse particles may clog openings of a printing screen.

As used herein, the average particle size is determined as a weight average value D50 in particle size distribution measurement by the laser light diffraction method.

In the conductive circuit-forming ink composition, the amount of component (C) loaded is preferably up to 120 parts, more preferably 40 to 120 parts, and even more preferably 50 to 100 parts by volume per 100 parts by volume of component (A). If component (C) is less than 40 parts by volume, the resulting silicone rubber may have a low conductivity. If component (C) exceeds 120 parts by volume, the resulting composition may become difficult to handle.

D) Conductive Micro-Particles

The conductive circuit-forming ink composition contains (D) conductive micro-particles having an average particle size of less than 5 microns (μm), selected from among metal particles, gold-plated particles, silver-plated particles, and copper-plated particles.

The conductive micro-particles as component (D) include metal particles such as gold, silver and copper particles, and metallized particles such as gold-plated particles, silver-plated particles, and copper-plated particles. Inter alia, metal nano-particles having an average particle size of less than 1 μm such as gold, silver and copper nano-particles are preferred.

The conductive micro-particles as component (D) should have an average particle size of less than 5 μm, preferably 20 nm to 1 μm, and more preferably 100 nm to 1 μm. In the ink composition, the addition of conductive micro-particles having an average particle size of less than 5 μm causes only a little change in bulk resistivity and mainly contributes to a reduction of contact resistance at the interface.

In the ink composition, the amount of component (D) loaded should be at least 1 part, more preferably 1 to 20 parts, and even more preferably 2 to 10 parts by volume per 100 parts by volume of component (A). If component (D) is less than 1 part by volume, it may be insufficient to contribute to a reduction of contact resistance. If component (D) exceeds 20 parts by volume, it may adversely affect the thixotropy and viscosity of the ink composition, which becomes ineffective in printing. Since conductive micro-particles with an average particle size of less than 5 μm are, in most cases, more expensive than conductive particles with an average particle size of at least 5 μm, it is recommended from the economical aspect to achieve an improvement in contact resistance with a minimal amount of conductive micro-particles added. Since the addition of such nano-size particles is accompanied by a buildup of thixotropy and viscosity of the ink composition, the addition amount is restricted in terms of printability. For the purpose of reducing contact resistance, the amount of nano-size particles added may be up to 10 parts by volume per 100 parts by volume of component (A) and typically equal to or less than the amount of carbon black added as the thixotropic agent. It is preferred for circuit shape stabilization that the composition is tailored optimum by adding an additional thixotropic agent.

The conductive particles as component (C) and the conductive micro-particles as component (D) need not necessarily be of the same type. For example, to the composition loaded with silver-plated plastic particles as component (C), silver nano-particles may be added as component (D).

E) Thixotropic Agent

A thixotropic agent (E) is contained in the conductive circuit-forming ink composition. It imparts thixotropy to the ink composition and ensures that the printed pattern maintains its shape from the printing step to the curing step. The thixotropic agent is selected from among carbon black, zinc white, tin oxide, tin-antimony oxide, and silicon carbide (SiC) having a medium electrical resistance, with carbon black being most preferred.

When a pattern having a steric shape is printed using an ink composition, the ink composition must have thixotropy in order to maintain the shape of the ink pattern as printed until the pattern is heat cured. For enhancing the thixotropy of a material having a sufficient fluidity to print, it is a common practice to add a thixotropic agent thereto. The inventor first attempted to add dry silica as the thixotropy enhancer. It was empirically found that as the amount of silica added is increased, the composition increases not only thixotropy, but also electrical resistance. The attempt failed to formulate a composition meeting both thixotropy and conductivity. With an intention to improve conductivity, the inventor then attempted to add carbon black having a medium value of electrical resistance. Surprisingly, it was found that as the amount of carbon black added is increased, thixotropy increases, and electrical resistance remains unchanged or rather decreases. While conductive silicone compositions having carbon black added thereto are widely known in the art, they mostly have a resistivity of about 1 Ω·cm, which corresponds to an extremely low level of conductivity as compared with the conductivity in a range of $1 \times 10^{-2}$ to $1 \times 10^{5}$ Ω·cm as intended herein. Although the reason why the addition of a thixotropic agent having a medium value of electrical resistance, typically carbon black lowers the electrical resistance of a conductive particle-loaded ink composition is not well understood, the use of a thixotropic agent having a medium value of electrical resistance enables to control thixotropy independent of conductivity.

Any carbon black species commonly used in conductive rubber compositions may be used as the thixotropic agent. Examples include acetylene black, conductive furnace black (CF), super-conductive furnace black (SCF), extra-conductive furnace black (XCF), conductive channel black (CC), as well as furnace black and channel black which have been heat treated at high temperatures of 1,500° C. to 3,000° C. Of these, acetylene black is most preferred in the practice of the invention because it has a high conductivity due to a low impurity content and fully developed secondary structure.

Component (E) is preferably used in an amount of 0.5 to 30 parts, more preferably 1 to 20 parts by weight per 100 parts by weight of component (A). Less than 0.5 parts by weight of component (E) may provide poor shape retention whereas a composition containing more than 30 parts by weight of component (E) may have too high a viscosity to handle.

F) Hydrosilylation Catalyst

The addition or hydrosilylation reaction catalyst is a catalyst for promoting addition reaction between alkenyl groups in component (A) and silicon-bonded hydrogen atoms (i.e., SiH groups) in component (B). For hydrosilylation reaction, any well-known catalysts such as platinum group metal based catalysts may be used.

Any well-known platinum group metal based catalysts may be used as the hydrosilylation catalyst. Examples include platinum group metals alone such as platinum black, rhodium, and palladium; platinum chloride, chloroplatinic acid and chloroplatinic acid salts such as $H_2PtCl_4 \cdot yH_2O$, $H_2PtCl_6 \cdot yH_2O$, $NaHPtCl_6 \cdot yH_2O$, $KHPtCl_6 \cdot yH_2O$, $Na_2PtCl_6 \cdot yH_2O$, $K_2PtCl_4 \cdot yH_2O$, $PtCl_4 \cdot yH_2O$, $PtCl_2$, and $Na_2HPtCl_4 \cdot yH_2O$ wherein y is an integer of 0 to 6, preferably 0 or 6; alcohol-modified chloroplatinic acid (U.S. Pat. No. 3,220,972); chloroplatinic acid-olefin complexes (U.S. Pat. No. 3,159,601, 3,159,662, and 3,775,452); platinum group metals such as platinum black and palladium on supports such as alumina, silica and carbon; rhodium-olefin complexes; chlorotris(triphenylphosphine)rhodium (Wilkinson catalyst); and complexes of platinum chloride, chloroplatinic acid and chloroplatinic acid salts with vinyl-containing siloxanes, especially vinyl-containing cyclosiloxanes. Of these, from the standpoints of compatibility and chlorine impurity, preference is given to silicone-modified chloroplatinic acid, specifically a platinum catalyst obtained by modifying chloroplatinic acid with tetramethyldivinyldisiloxane.

Component (F) is preferably added in such amounts as to give 1 to 500 ppm, more preferably 3 to 100 ppm, and even more preferably 5 to 80 ppm of platinum atom based on the total weight of the ink composition components.

Preferably, the conductive ink composition may further comprise a stabilizer and a tackifier.

Stabilizer

Preferably a stabilizer is added to the conductive circuit-forming ink composition so that the composition may undergo consistent addition cure. Suitable stabilizers include fatty acids and acetylene compounds. More preferably, fatty acids, fatty acid derivatives, and/or metal salts thereof are added. When fatty acids, fatty acid derivatives, and/or metal salts thereof are used as the stabilizer, the amount of the stabilizer added is preferably 0.1 to 10 parts, more preferably 0.1 to 5 parts by weight per 100 parts by weight of component (A). Less than 0.1 pbw of the stabilizer may fail to ensure a consistent curing behavior after shelf storage whereas more than 10 pbw may adversely affect the addition curability. The preferred fatty acids, fatty acid derivatives, and metal salts thereof are of at least 8 carbon atoms.

Suitable fatty acids include caprylic acid, undecylenic acid, lauric acid, myristic acid, palmitic acid, margaric acid, stearic acid, arachic acid, lignoceric acid, cerotic acid, melissic acid, myristoleic acid, oleic acid, linoleic acid, and linolenic acid.

Suitable fatty acid derivatives include fatty acid esters and aliphatic alcohol esters. Suitable fatty acid esters include polyhydric alcohol esters such as esters of the foregoing fatty acids with $C_1$-$C_5$ lower alcohols, sorbitan esters, and glycerol esters. Suitable aliphatic alcohol esters include esters of saturated alcohols such as octyl alcohol, lauryl alcohol, myristyl alcohol, and stearyl alcohol, with fatty acids including dibasic acids such as glutaric acid and suberic acid, and tribasic acids such as citric acid.

Suitable fatty acid metal salts include metal salts such as lithium, calcium, magnesium and zinc salts of fatty acids such as caprylic acid, undecylenic acid, lauric acid, myristic acid, palmitic acid, margaric acid, stearic acid, arachic acid, lignoceric acid, cerotic acid, melissic acid, myristoleic acid, oleic acid, linoleic acid, and linolenic acid.

Inter alia, stearic acid and salts thereof are most preferred as the stabilizer. The stabilizer may be added alone or as a premix with the hydrosilylation reaction catalyst.

Tackifier

The tackifier is added to the ink composition for rendering it more self-adhesive to the substrate. Suitable tackifiers are compounds having an epoxy and/or alkoxysilyl group. When used, the tackifier is preferably added in an amount of 0.5 to 20 parts, more preferably 1 to 10 parts by weight per 100 parts by weight of component (A). Less than 0.5 pbw of the tackifier is ineffective for imparting adhesion. More than 20 pbw of the tackifier may adversely affect the shelf stability of the composition, allow the hardness of the cured composition to change with time, and sometimes, cause a change of the pattern shape due to outgassing, depending on certain components.

It is noted that when a tackifier having a silicon-bonded hydrogen atom (i.e., SiH group) is used, it is preferably added in such amounts that 0.5 to 5.0 moles, more preferably 0.7 to 3.0 moles of SiH groups in component (B) plus the tackifier may be available per mole of alkenyl groups in component (A).

Exemplary tackifiers are given below.

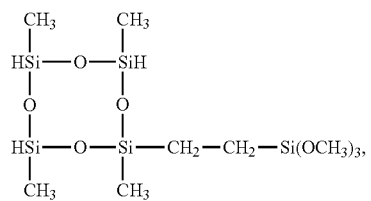

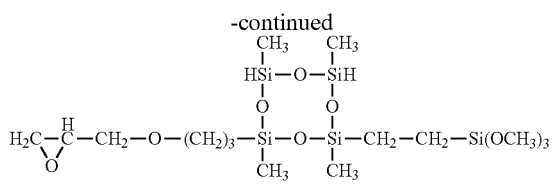

Besides the foregoing components, any other additives may be added to the conductive ink composition if desired. In particular, a hydrosilylation reaction retarder may be added for the purpose of enhancing storage stability. The reaction retarder may be selected from well-known ones, for example, acetylene compounds, compounds containing at least two alkenyl groups, alkynyl-containing compounds, triallyl isocyanurate and modified products thereof. Inter alia, the alkenyl and alkynyl-containing compounds are desirably used. The reaction retarder is desirably added in an amount of 0.05 to 0.5 part by weight per the total weight (=100 parts by weight) of other components in the ink composition. Outside the range, a less amount of the retarder may be ineffective in retarding hydrosilylation reaction whereas an excess of the retarder may interfere with the cure process.

The ink composition may be prepared, for example, by mixing the foregoing components on a mixer such as planetary mixer, kneader or Shinagawa mixer.

The ink composition has a viscosity and thixotropy index, which are important factors in forming conductive circuits according to the invention. Preferably the ink composition has a viscosity at 25° C. of 10 to 200 Pa·s, more preferably 20 to 100 Pa·s, as measured by HAAKE RotoVisco 1 (Thermo Scientific) at a rotational speed of 10 radian/sec. An ink composition having a viscosity of less than 10 Pa·s may flow and fail to retain the shape when the composition is dispensed or otherwise applied or when heat cured. An ink composition having a viscosity of more than 200 Pa·s may fail to follow the mask pattern faithfully when dispensed, leaving defects in the pattern. The thixotropy index, which is defined as the ratio of the viscosity at a shear rate of 0.5 radian/sec to the viscosity at 10 radian/sec of the composition at 25° C., is preferably at least 1.1, and more preferably 1.5 to 5.0. A composition having a thixotropy index of less than 1.1 may be difficult to stabilize the shape as applied.

The ink composition for use in the conductive circuit-forming method is substantially free of a solvent. When a hydrosilylation reaction catalyst is prepared, a slight amount of solvent may be carried over in the catalyst. Even in such a case, the amount of solvent should preferably be less than 0.1% by weight of the overall composition.

By virtue of the substantial absence of solvents, the ink composition whose viscosity and thixotropy have been adjusted as above has such physical properties that when a pattern of dots shaped to have a diameter of 0.8 mm and a height of 0.4 mm is printed and heat cured at 80 to 200° C., the dot shape may experience a change of height within 5% on comparison between the shape as printed and the shape as cured. That is, a height change of the dot shape before and after curing is within 5%. The shape retaining ability of an ink composition can be evaluated by comparing the shape as printed with the shape as cured in this way. The shape to be compared is not limited to the dot shape, and a line shape may be used instead. The dot shape is preferably adopted herein because the dot shape follows a sharp change depending on the shape retaining ability. Values of shape change may be measured by various optical procedures. For example, measurement may be carried out by using a confocal laser microscope, determining the pattern shape as printed prior to cure and the pattern shape as cured, and comparing the maximum height of the pattern relative to the substrate. The composition which is to pass the test does not show a substantial change of the pattern shape even when the holding time from pattern formation by printing to heat curing is varied. For the composition which is to fail the test, the holding time from pattern formation by printing to heat curing may be set arbitrary because this composition undergoes a shape change during the curing step.

The printing technique used in the conductive circuit-forming method is not particularly limited as long as the amount of the ink composition applied can be controlled at a high accuracy. The preferred printing techniques are dispense printing and screen printing. The screen printing technique capable of high accuracy control is more preferred. As long as the viscosity and thixotropy of the ink composition are adjusted in accordance with the mask shape used in printing, the screen printing technique may comply with a pattern size having a minimum line width in the range from several tens of microns to several hundreds of microns (μm).

According to the method, a conductive circuit is formed by printing a circuit pattern using an ink composition as defined herein and curing the pattern. To complete the conductive circuit pattern while maintaining the shape as printed intact, the pattern is cured under appropriate conditions, preferably at 100 to 200° C. for 1 to 120 minutes. In the curing step, any of well-known heating devices such as hot plate and oven may be selected in accordance with the substrate used.

EXAMPLE

Examples of the invention are given below by way of illustration and not by way of limitation.

Examples 1 to 6 & Comparative Examples 1 to 3

Preparation of Ink Composition

Ink compositions of Examples 1 to 6 and Comparative Examples 1 to 3 were prepared by mixing amounts of selected components as shown in Table 1 in an axial/planetary motion mixer (HIVIS MIX® Model 2P-03 by Primix Corp.) until uniform. It is noted that the viscosity of the composition is measured at 25° C. by HAAKE RotoVisco 1 (Thermo Scientific) at a rotational speed of 10 radian/sec; and the average particle size is a weight average value D50 in particle size distribution measurement by the laser light diffraction method.

(A) Dimethylvinylsiloxy-endcapped dimethylpolysiloxane having a weight average degree of polymerization of 250 and a viscosity of 600 mPa·s (B-1) Methylhydrogenpolysiloxane(dimethylsiloxane-methylhydrogensiloxane copolymer) with SiH group on side chain, having a viscosity of 5 mPa·s at 25° C. and a hydrogen gas release of 350 ml/g (B-2) Alkoxy-containing compound of the following formula (3):

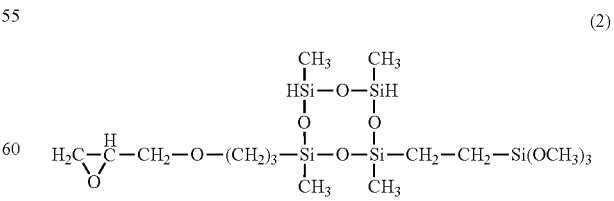

(C-1) Silver-plated phenolic resin powder, average particle size 10 μm (Mitsubishi Materials Corp.)

(C-2) Silver-plated acrylic resin powder, average particle size 25 μm (Mitsubishi Materials Corp.)

(C-3) Silver powder AgC-237 (as acetone cleaned and dried), average particle size 7.2 μm (Fukuda Metal Foil and Powder Co., Ltd.)
(D-1) Superfine silver powder-1, average particle size 100 nm (DOWA Electronics Co., Ltd.)
(D-2) Superfine silver powder-2, average particle size 300 nm (DOWA Electronics Co., Ltd.)
(D-3) Superfine silver powder-3, average particle size 700 nm (DOWA Electronics Co., Ltd.)
(D-4) High-conductivity silver nanoparticle paste MDot®, average particle size several tens of nanometers (Mitsuboshi Belting Ltd.)
(E) Denka Black HS-100 (Denki Kagaku Kogyo K.K.)

thickness of 0.5 mm and an opening diameter of 0.75 mm to form an ink pattern of dots on the substrate. The shape of the ink pattern was observed under a confocal laser microscope VK-9700 (Keyence Corp.). The diameter and the maximum height (relative to the substrate) of dots were measured. Next, the pattern-bearing aluminum substrate was placed in an oven where the dot pattern was cured at 150° C. for 1 hour. The maximum height (relative to the substrate) of dots in the cured pattern was measured again using the laser microscope. A ratio (%) of the maximum height of dot pattern as cured to the maximum height of dot pattern prior to cure is reported as shape retention in Table 1.

The measurement results are shown in Table 1.

TABLE 1

| Amount (pbw) | | Example | | | | | | Comparative Example | | |
|---|---|---|---|---|---|---|---|---|---|---|
| | | 1 | 2 | 3 | 4 | 5 | 6 | 1 | 2 | 3 |
| (A) | | 90 | 90 | 90 | 90 | 90 | 90 | 90 | 90 | 90 |
| (B) | (B-1) | 2 | 2 | 2 | 2 | 2 | 2 | 2 | 2 | 2 |
| | (B-2) | 6 | 6 | 6 | 6 | 6 | 6 | 6 | 6 | 6 |
| (C) | (C-1) | 138 | 138 | 138 | 138 | | | 138 | | |
| | (C-2) | | | | | 170 | | | 170 | |
| | (C-3) | | | | | | 555 | | | 555 |
| (D) | (D-1) | 42 | | | | | | | | |
| | (D-2) | | 42 | | | | | | | |
| | (D-3) | | | 42 | | 42 | 42 | | | |
| | (D-4) | | | | 21 | | | | | |
| (E) | | 4 | 4 | 4 | 4 | 4 | 4 | 6 | 6 | 8 |
| (F) | (F-1) | | | 0.2 | 0.2 | | | | | |
| | (F-2) | 0.33 | 0.33 | | | 0.33 | 0.33 | 0.33 | 0.33 | 0.33 |
| Stabilizer | | | | 0.2 | 0.2 | | | | | |
| Reaction retarder | | 0.2 | 0.2 | 0.2 | 0.2 | 0.2 | 0.2 | 0.2 | 0.2 | 0.2 |
| Results | | | | | | | | | | |
| Volume resistivity (Ω·cm) | | $3.30 \times 10^{-3}$ | $2.95 \times 10^{-3}$ | $2.90 \times 10^{-3}$ | $2.90 \times 10^{-3}$ | $2.90 \times 10^{-3}$ | $2.80 \times 10^{-3}$ | $2.92 \times 10^{-3}$ | $3.10 \times 10^{-2}$ | $2.90 \times 10^{-3}$ |
| Resistivity* (Ω) | | 0.28 | 0.25 | 0.21 | 0.31 | 0.52 | 0.12 | 1.34 | 1.68 | 1.05 |
| Shape retention | | 99% | 99% | 98% | 100% | 98% | 98% | 100% | 99% | 99% |

*resistivity of printed dot with diameter 400 μm and height 150 μm (F-1) Platinum catalyst derived from chloroplatinic acid and having tetramethylvinyldisiloxane ligand (Pt content 1 wt %)
(F-2) Mixture of (F-1) and stearic acid in a weight ratio of 3/2
Stabilizer: stearic acid
Reaction retarder: 1-ethynyl-1-cyclohexanol Measurement of Volume Resistivity (Conductivity)

The ink composition prepared above was cast into a frame to a thickness of 1 mm and cured in an oven at 150° C. for 1 hour, yielding a (cured) conductive silicone rubber sheet. The sheet was measured for volume resistivity (conductivity) by the four-terminal method using a DC voltage current source/monitor ADCMT 6241A (ADC Corp.).

Measurement of Resistivity

The ink composition prepared above was screen printed on a solder-plated copper plate to form a pattern of dots having a diameter of 400 μm and a height of 150 μm and cured in an oven at 150° C. for 1 hour to form a conductive silicone rubber pattern. The pattern was measured for resistivity by the two-terminal method using a DC voltage current source/monitor ADCMT 6241A (ADC Corp.).

Shape Retention

Shape retention was evaluated using a pattern of dots shaped to have a diameter of 0.8 mm and a height of 0.4 mm. The ink composition was applied to an aluminum substrate through a punched sheet of tetrafluoroethylene having a It is noted that the amount (in parts by volume) of component (C) relative to 100 parts by volume of component (A) is 40 parts in Example 1, 40 parts in Example 2, 40 parts in Example 3, 40 parts in Example 4, 53 parts in Example 5, and 40 parts in Example 6. The amount (in parts by volume) of component (D) relative to 100 parts by volume of component (A) is 4.4 parts in Example 1, 4.4 parts in Example 2, 4.4 parts in Example 3, 2.2 parts in Example 4, 4.4 parts in Example 5, and 4.4 parts in Example 6.

Japanese Patent Application No. 2013-128618 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for forming a conductive circuit comprising the steps of printing a pattern using a conductive ink composition and curing the pattern into a conductive circuit,
said conductive ink composition being a substantially solvent-free, liquid, addition curable, conductive circuit-forming ink composition comprising
(A) an organopolysiloxane having at least two silicon-bonded alkenyl groups, (B) an organohydrogenpolysiloxane having at least two silicon-bonded hydrogen atoms,
(C) conductive particles having an average particle size of at least 5 μm, selected from the group consisting of metal particles, gold-plated particles, silver-plated particles, and copper-plated particles,
(D) conductive micro-particles having an average particle size of less than 5 μm, selected from the group consisting of metal particles, gold-plated particles, silver-plated particles, and copper-plated particles, component (D) being present in an amount of at least 1 part by volume per 100 parts by volume of component (A),
(E) a thixotropic agent, and
(F) a hydrosilylation catalyst.

2. The method of claim 1 wherein in the ink composition, component (C) is present in an amount of up to 120 parts by volume and component (D) is present in an amount of up to 20 parts by volume per 100 parts by volume of component (A).

3. The method of claim 1 wherein component (E) is selected from the group consisting of carbon black, zinc white, tin oxide, tin-antimony oxide, and silicon carbide.

4. The method of claim 1 wherein the printing step includes screen printing.

5. A conductive circuit which has been formed by the method of claim 1.

6. A conductive circuit-forming ink composition as set forth in claim 1.

* * * * *